United States Patent [19]
Kraiczyk

[11] Patent Number: 5,991,159
[45] Date of Patent: *Nov. 23, 1999

[54] CHIP CARD

[75] Inventor: Josef Kraiczyk, Regensburg, Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/717,830

[22] Filed: Sep. 23, 1996

[30]      Foreign Application Priority Data

Sep. 22, 1995 [DE] Germany ............................ 195 35 324

[51] Int. Cl.⁶ .................................................... H05K 1/14
[52] U.S. Cl. ......................... 361/737; 361/736; 361/742; 361/752; 361/758; 235/492
[58] Field of Search ..................................... 361/736, 737, 361/742, 748, 749, 752, 758, 770, 818, 746, 757; 235/380, 492, 441, 439, 487

[56]          References Cited

U.S. PATENT DOCUMENTS

| | | |
|---|---|---|
| 4,158,230 | 6/1979 | Washizuka et al. . |
| 4,577,286 | 3/1986 | Yoshimura et al. . |
| 5,005,106 | 4/1991 | Kiku ........................................ 361/737 |
| 5,527,989 | 6/1996 | Leeb ................................... 174/35 GC |

FOREIGN PATENT DOCUMENTS

| | | |
|---|---|---|
| 0 481 776 | 4/1992 | European Pat. Off. . |
| 31 43 915 A1 | 5/1983 | Germany . |
| 32 06 434 | 9/1983 | Germany . |
| 92 21105 | 11/1992 | WIPO . |

*Primary Examiner*—Leo P. Picard
*Assistant Examiner*—Jayprakash N. Gandhi
*Attorney, Agent, or Firm*—Herbert L. Lerner; Laurence A. Greenberg

[57]            ABSTRACT

A chip card has flexible housing parts which are secured on one another. When the housing parts are secured to one another, support elements of the housing parts form voids, in which a flexible printed circuit board is disposed along with its components. In order to ensure that the components will not be mechanically stressed, one lubricant film is disposed between each of the housing parts and the printed circuit board and the components. The printed circuit board or components slide on the film when the card is bent.

8 Claims, 2 Drawing Sheets

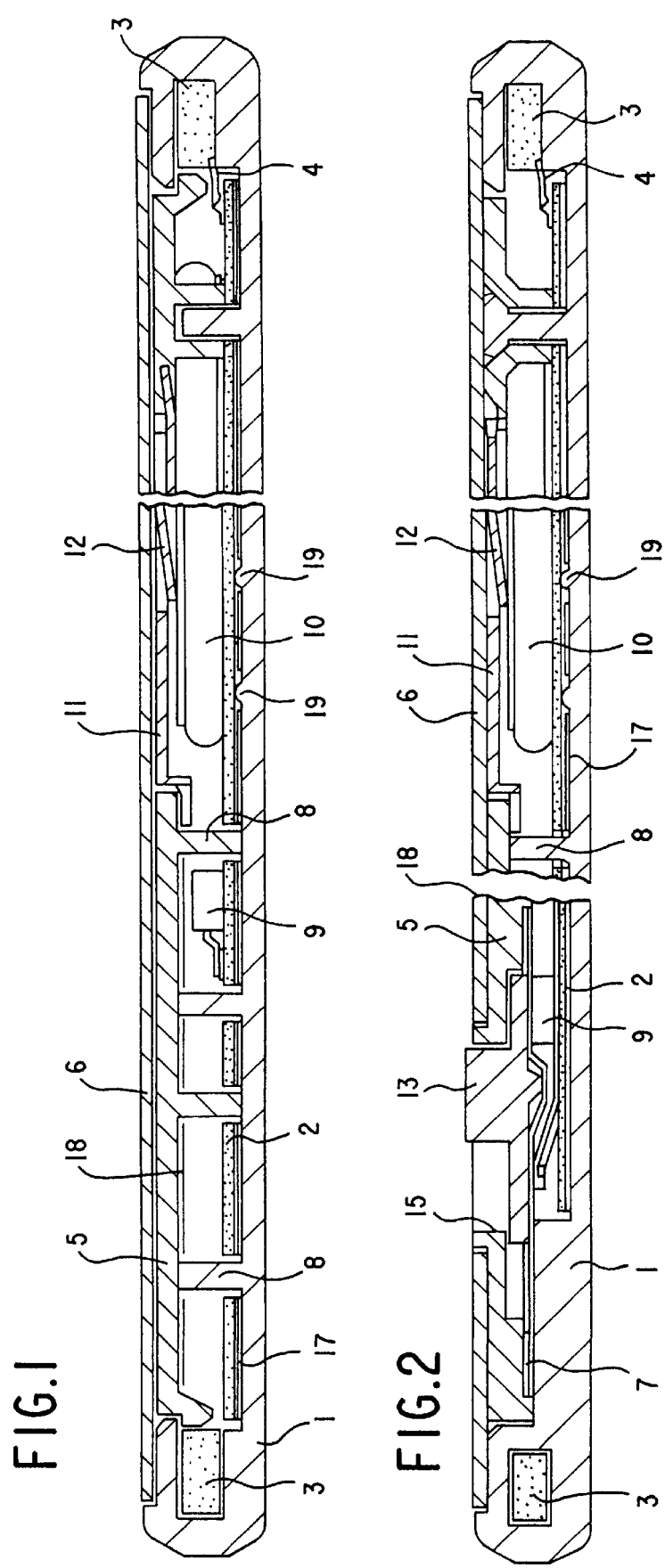

CHIP CARD

BACKGROUND OF THE INVENTION

Field of the Invention

The invention relates to a chip card which is used particularly as a code transducer for an access control system of a motor vehicle.

A chip card which is known from German Published, Nonprosecuted Patent Application DE 31 43 915 A1 has a flexible film on which a printed circuit is disposed. The printed circuit is disposed in the interior of the chip card and is covered with a protective film.

Only integrated semiconductor circuits are provided on such chip cards, but not discrete components as switches, capacitors or batteries.

Chip cards that are known from Published European Patent Application 0 481 776 A2 and Published International Patent Application WO 92/21105 have well-like housing parts in which a printed circuit board that carries a circuit is disposed. Additional electronic components are likewise secured between the housing parts. However, such chip cards are quite vulnerable to damage, especially from bending of the chip card.

SUMMARY OF THE INVENTION

It is accordingly an object of the invention to provide a chip card, which overcomes the hereinafore-mentioned disadvantages of the heretofore-known devices of this general type and which is constructed simply and in a manner secured against damage.

With the foregoing and other objects in view there is provided, in accordance with the invention, a chip card, comprising a flexible, well-like lower housing part; a printed circuit board for carrying a circuit with components in the lower housing part; a flexible upper housing part secured to the lower housing part for sealing off the circuit from external influences; support elements integrally constructed with one of the housing parts for keeping the housing parts mutually spaced apart and creating a void in which the printed circuit board and the components of the circuit are disposed; a transmit and receive element disposed in the lower housing part and electrically connected to the circuit; and a smooth, slidable surface disposed between the components on the printed circuit board and the upper housing part and/or between the printed circuit board and the lower housing part.

In accordance with another feature of the invention, the smooth, slidable surfaces are smooth and slidable inner surfaces of the lower housing part and the upper housing part facing the void, or a lubricant film disposed between the components on the printed circuit board and the upper housing part and/or a lubricant film disposed between the printed circuit board and the lower housing part.

In accordance with a further feature of the invention, the printed circuit board is flexible.

In accordance with an added feature of the invention, there is provided a touch switch associated with the upper housing part, the upper housing part being soft-elastic in the vicinity of the touch switch permitting the touch switch to be actuated from outside.

In accordance with an additional feature of the invention, the upper housing part is interlocked with the lower housing part, and there is provided a cover film releasably glued to the upper housing part and portions of the lower housing part.

In accordance with yet another feature of the invention, there is provided a battery or accumulator disposed in the void.

In accordance with a concomitant feature of the invention, the transmit and receive element is a coil having windings embedded in the lower housing part and electrically connected to the printed circuit board.

Other features which are considered as characteristic for the invention are set forth in the appended claims.

Although the invention is illustrated and described herein as embodied in a chip card, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view through a first exemplary embodiment of a chip card according to the invention;

FIG. 2 is a view similar to FIG. 1 of a section through the chip card in the region of a touch switch;

DESCRIPTION OF THE PREFERRED EMBODIMENTS

Figure 3:
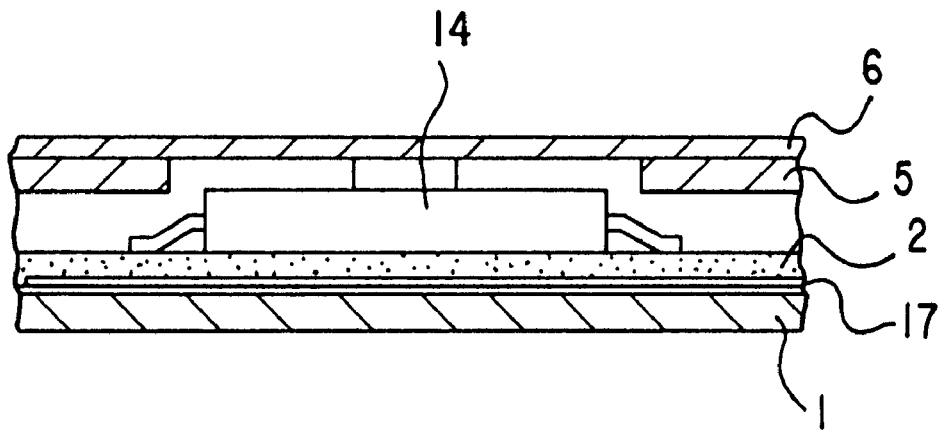
FIG. 3 is a fragmentary, sectional view through a second exemplary embodiment of a chip card according to the invention.

A chip card (also known as a smart card or a multifunction chip card) is used as a code transducer for an access control system for a motor vehicle. To that end, the chip card has at least one transmitter, which transmits a code signal. The transmitter can be actuated in various ways. For instance, a received signal can trip a code signal. However, actuation of a switch on the chip card can also lead to transmission of the code signal.

Referring now to the figures of the drawings in detail and first, particularly, to FIG. 1 thereof, there is seen such a chip card according to the invention that has a well-like, flexible lower housing part 1 in which a flexible printed circuit board 2 is disposed. A circuit that contains the transmitter and the receiver is disposed on the printed circuit board 2.

An antenna in the form of a coil 3 is embedded in the lower housing part 1 for sending and receiving signals. The coil 3 rests with its winding around the printed circuit board 2 and is electrically connected to the printed circuit board 2 through connection wires 4.

A flexible upper housing part 5 is secured to the lower housing part 1 and tightly closes off an interior of the housing. The upper housing part 5 can be physically interlocked with the lower housing part 1, welded to it or joined to it in some other, functionally equivalent way. In addition, a cover film or foil 6 can be glued onto the upper housing part 5 and edges of the lower housing part 1, so that the interior of the housing is sealed off in a dustproof and waterproof manner. Sealing films or foils 7 that additionally seal off the housing interior can also be placed between the housing parts 1 and 5, as is seen in FIG. 2.

The cover film 6 and the upper housing part 5 may also be integrally constructed. However, it is advantageous if the upper housing part 5 and the cover film 6 are separably secured to the upper housing part 1, so that batteries which may possibly be located in the chip card can be replaced if needed.

The cover film 6 seals off a single externally accessible seam between the two housing parts 1 and 5. To that end, the cover film 6 may be constructed as a pressure-sensitive adhesive film. The adhesive bond can then be undone again, if it should become necessary to open the chip card.

The upper housing part 5 or the lower housing part 1 have support elements 8 produced integrally with them, that establish a spacing between the two housing parts 1 and 5. This creates one or more voids, hollow spaces or cavities in which components 9 of the circuit are disposed. If the chip card is mechanically stressed, pressure is distributed by the support elements 8 onto the housing parts 1 and 5. Thus the components 9 of the circuit remain free from external mechanical pressure.

Components of the circuit in the form of batteries 10 or accumulators that supply the circuit with energy are also disposed in the chip card. For the sake of electrical contacting, a metal contact sheet 11 with elastic contact springs 12 rests on poles of the batteries 10 on one hand and connects these poles either to one another or to the printed circuit board 2. On the other hand, the components or batteries 10 rest with different poles on the printed circuit board 2.

One or more pushbutton switches 13 shown in FIG. 2 or touch switches 14 shown in FIG. 3, which are to be actuated from outside, can also be disposed on the printed circuit board 2. In order to provide a touch switch 14, the upper housing part 5 is soft-elastically constructed in the region of the touch switch 14, so that the upper housing part 5 can easily be indented to actuate the touch switch 14. In order to provide a pushbutton switch 13, a hole 15 is provided in the upper housing part 5 in the region of the pushbutton switch 13. Edges of the hole 15 are sealed off by an additional sealing film 7.

Figure 4:
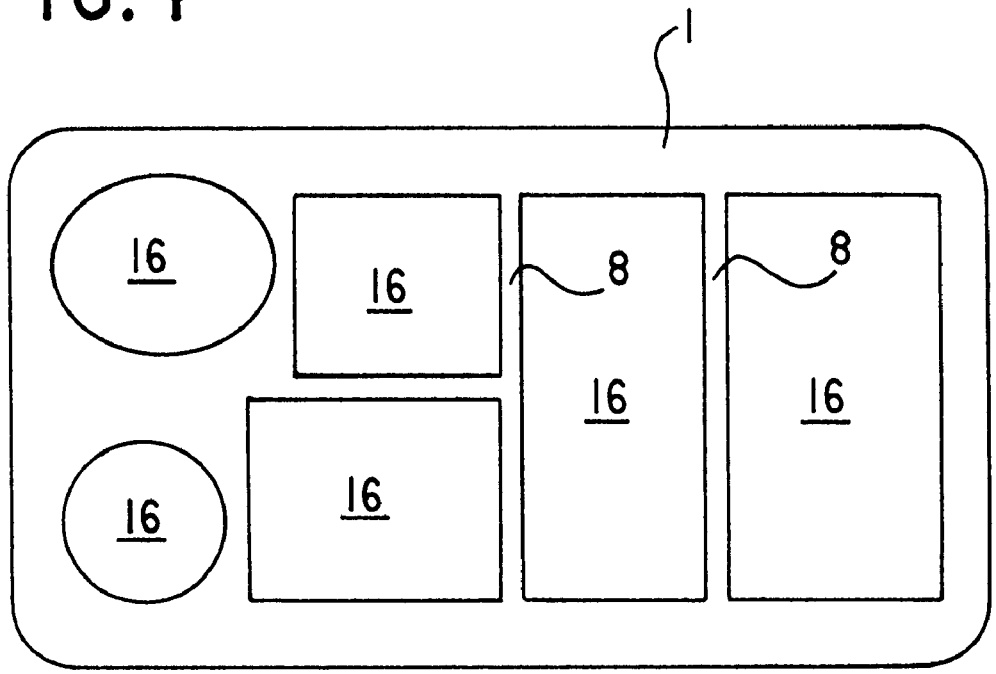
FIG. 4 is an elevational view of a lower housing part of the chip card.

The lower housing part 1 and the upper housing part 5 are made of a flexible, supple material, such as polyamide. FIG. 4 shows recesses 16 in the housing parts 1 and 5 that can be milled out or created by injection molding using a suitable injection mold. The components 9 and batteries 10 of the circuit are disposed in the recesses 16, which form the void when the upper housing part 5 is in place.

Due to the supple material of the housing parts 1 and 5 and due to the support elements 8, damage to the chip card from use of the chip card, with the attendant unavoidable bending of the chip card, are prevented. Moreover, the components 9 are disposed far enough away from each other on the printed circuit board 2 that they do not touch one another if the chip card bends.

If the chip card bends, the printed circuit board 2 with its components 9 shifts relative to the housing parts 1 and 5. The printed circuit board 2 is disposed in such a way as to be easily movable in the lower housing part 1, so that incident strains will not lead to damage to the printed circuit board 2.

Moreover, a lubricant film 17 may be disposed between the printed circuit board 2 and the lower housing part 1. A further lubricant film 18 may also be provided between the components 9 and the upper housing part 5. Instead of the lubricant films, the lower housing part 1 or the upper housing part 5 may have a smooth, slidable surface facing toward the circuit, on which the printed circuit board 2 and the components 9 can easily slide if the chip card bends. The bending of the chip card is thus only slightly transmitted to the printed circuit board 2 and the components 9. The lubricant films 17 and 18 are made of "TEFLON" or polycarbonate, for instance.

The printed circuit board 2 and the lubricant films 17 and 18 are recessed in the vicinity of the support elements 8. As a result, bending of the chip card and the attendant sliding of the printed circuit board 2 or components 9 is not hindered.

Individual support elements 8 may also serve to clamp the printed circuit board 2 and the lubricant film 17 between them and the housing parts 1 and 5 (as is shown for the support element 8 on the right in FIG. 1). Thus the printed circuit board 2 in the chip card is pressed against the lower housing part 1 at least at one point and is temporarily fixed. Consequently, the printed circuit board 2 is not displaced when the chip card bends.

The lower housing part 1 may have individual bumps 19, as a result of which the flexible printed circuit board 2 protrudes upward in the region of these bumps 19. If a component 9 or 10 (which is the battery 10 in FIGS. 1 and 2) that is to be contacted is disposed in this region on the other side of the printed circuit board 2, then the printed circuit board 2 is pressed against the component 9 or 10 in the region of the bumps 19, thus improving the electrical contact between the printed circuit board 2 and the component 9 or 10.

A plurality of batteries 10 or accumulators, which supply various parts of the circuit with energy depending on their function, may also be disposed on the chip card.

The upper housing part 5 or the cover film 6 may also have thin, transparent or translucent regions, beneath which a nonillustrated light source of the circuit is disposed. A display on the chip card that is likewise disposed in dust-proof and waterproof fashion in the interior of the chip card is thus possible.

I claim:

1. A chip card, comprising:
    a flexible, well-like lower housing part having a peripheral region and a central region;
    a printed circuit board having a circuit with components in said lower housing part;
    a flexible upper housing part secured to said lower housing part for sealing off said circuit from external influences;
    support elements provided at least at said central region and integrally constructed with one of said housing parts for keeping said housing parts mutually spaced apart and creating a void in which said printed circuit board and said components of said circuit are disposed;
    a first flexible lubricant film disposed between and not fixedly attached to said lower housing part and said printed circuit board, said first flexible lubricant film being smooth and slidable on both sides thereof;
    a second flexible lubricant film disposed between and not fixedly attached to said upper housing part and said printed circuit board, said second flexible lubricant film being smooth and slidable on both sides thereof; and
    said printed circuit board and said components being movable relative to at least one of said housing parts by sliding on at least one of said first and said second flexible lubricant films when said housing parts are being stressed.

2. The chip card according to claim 1, wherein said printed circuit board is flexible.

3. The chip card according to claim 1, including a touch switch associated with said upper housing part, said upper housing part being soft-elastic in the vicinity of said touch switch permitting said touch switch to be actuated from outside.

4. The chip card according to claim 1, wherein said upper housing part is interlocked with said lower housing part, and including a cover film releasably glued to said upper housing part and portions of said lower housing part.

5. The chip card according to claim 1, including a battery or accumulator disposed in said void.

6. The chip card according to claim 1, further including a coil having windings embedded in said lower housing part and electrically connected to said printed circuit board for transmitting and receiving signals.

7. The chip card according to claim 1, including a transmit and receive element disposed in said lower housing part and electrically connected to said circuit.

8. A chip card, comprising:

a flexible, well-like lower housing part having a peripheral region and a central region;

a printed circuit board having a circuit with components in said lower housing part;

a flexible upper housing part secured to said lower housing part for sealing off said circuit from external influences;

support elements provided at least at said central region and integrally constructed with one of said housing parts for keeping said housing parts mutually spaced apart and creating a void in which said printed circuit board and said components of said circuit are disposed;

a flexible lubricant film disposed between said upper housing part and said components and not fixedly attached to said upper housing part and said components, said flexible lubricant film being smooth and slidable on both sides thereof; and said printed circuit board and said components being movable relative to at least one of said housing parts by sliding on said flexible lubricant films when said housing parts are being stressed.

* * * * *